US006971075B2

(12) United States Patent
Lin

(10) Patent No.: US 6,971,075 B2
(45) Date of Patent: Nov. 29, 2005

(54) CIRCUIT DESIGN METHOD TO CONTROL ACCESS POINTERS OF DIFFERENT MEMORY

(75) Inventor: Che-Sheng Lin, Taipei (TW)

(73) Assignee: Destiny Technology Corporation, Taipei (TW)

( * ) Notice: Subject to any disclaimer, the term of this patent is extended or adjusted under 35 U.S.C. 154(b) by 166 days.

(21) Appl. No.: 10/626,736

(22) Filed: Jul. 25, 2003

(65) Prior Publication Data

US 2005/0018491 A1    Jan. 27, 2005

(51) Int. Cl.[7] ............................................. G06F 17/50
(52) U.S. Cl. ............................................. 716/3; 716/1
(58) Field of Search ............ 716/1, 3, 18; 710/13–19, 710/22–24, 26, 35–36, 39, 51, 120; 365/189.01–5; 711/111–112; 358/1.15–1.17; 370/412, 419

(56) References Cited

U.S. PATENT DOCUMENTS

| | | | |
|---|---|---|---|
| 6,009,245 A | * | 12/1999 | Kato et al. ................. 358/1.17 |
| 6,499,083 B1 | * | 12/2002 | Hamlin ....................... 711/112 |
| 2004/0085982 A1 | * | 5/2004 | Choi ........................... 370/412 |

* cited by examiner

Primary Examiner—Vuthe Siek
(74) Attorney, Agent, or Firm—Rabin & Berdo, P.C.

(57) ABSTRACT

A circuit design method to control access pointers of different memory used to transfer the data buffer of printers. The proposed control signal circuit employs a read control signal circuit and a write control signal circuit to receive and send m+n-bit control signals, respectively, to control the access pointers of a memory with $2^m*2^n$-register to perform buffer transfer in printers. The disclosed method is able to solve the problem that only one memory block is accessible in sequential mode before. In addition, the method is able to use all memory blocks in buffer transfer in sequential mode to increases the efficiency of data buffering when printing.

10 Claims, 7 Drawing Sheets

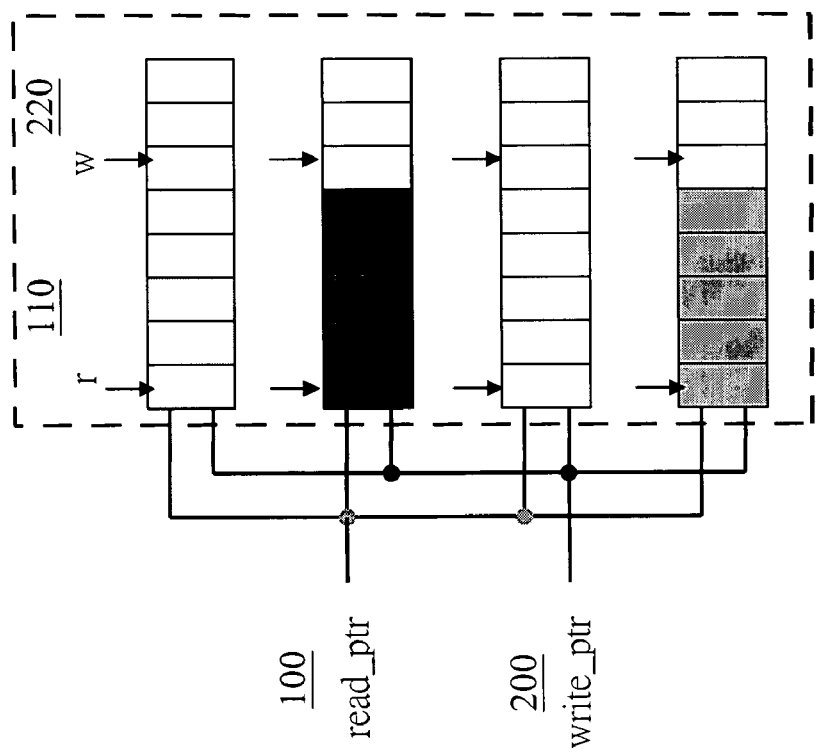
Figure 1-a (Prior Art)

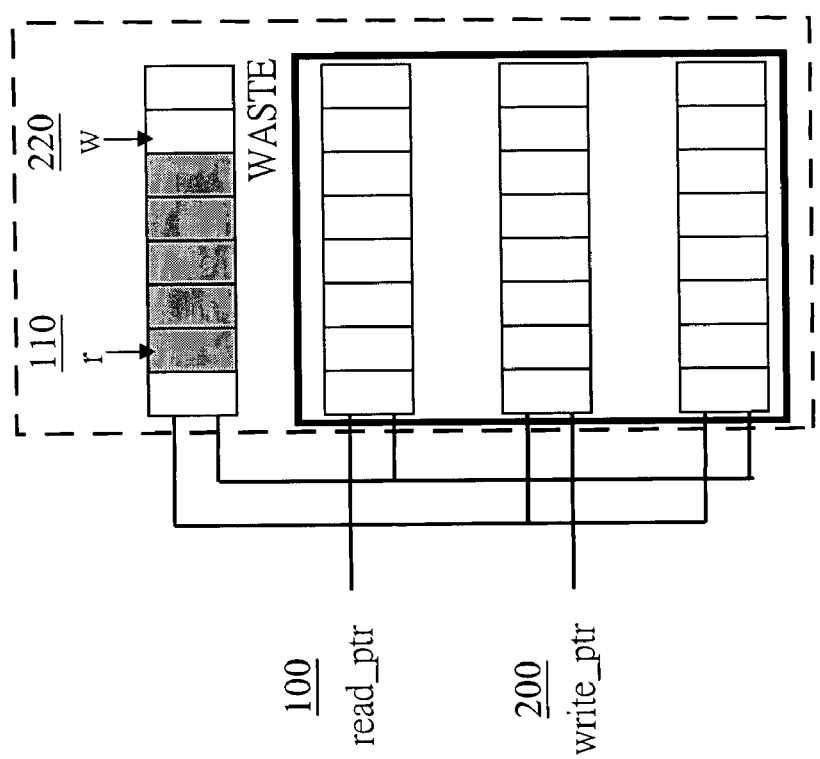
Figure 1-b (Prior Art)

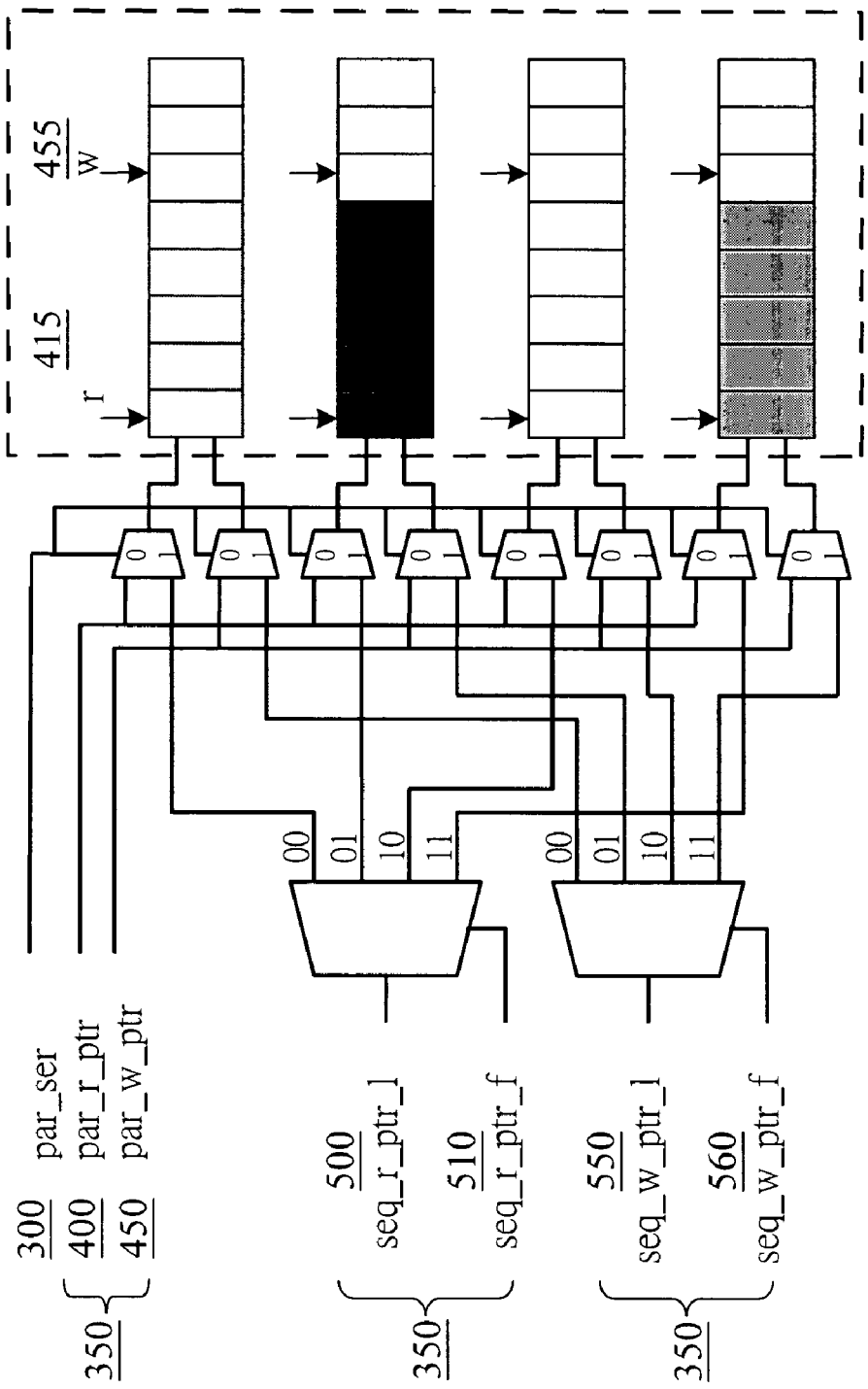
Figure 3-a

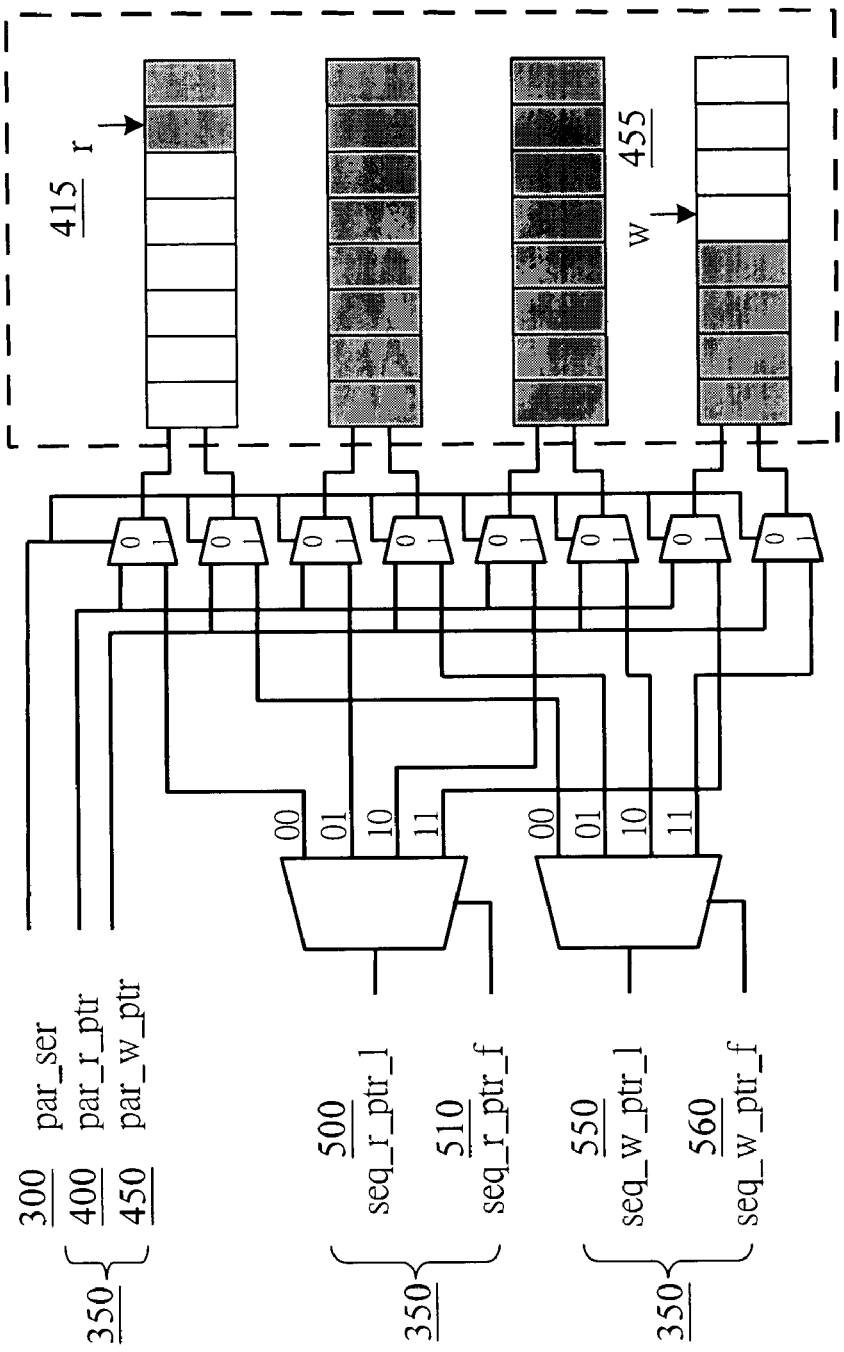
Figure 3-b

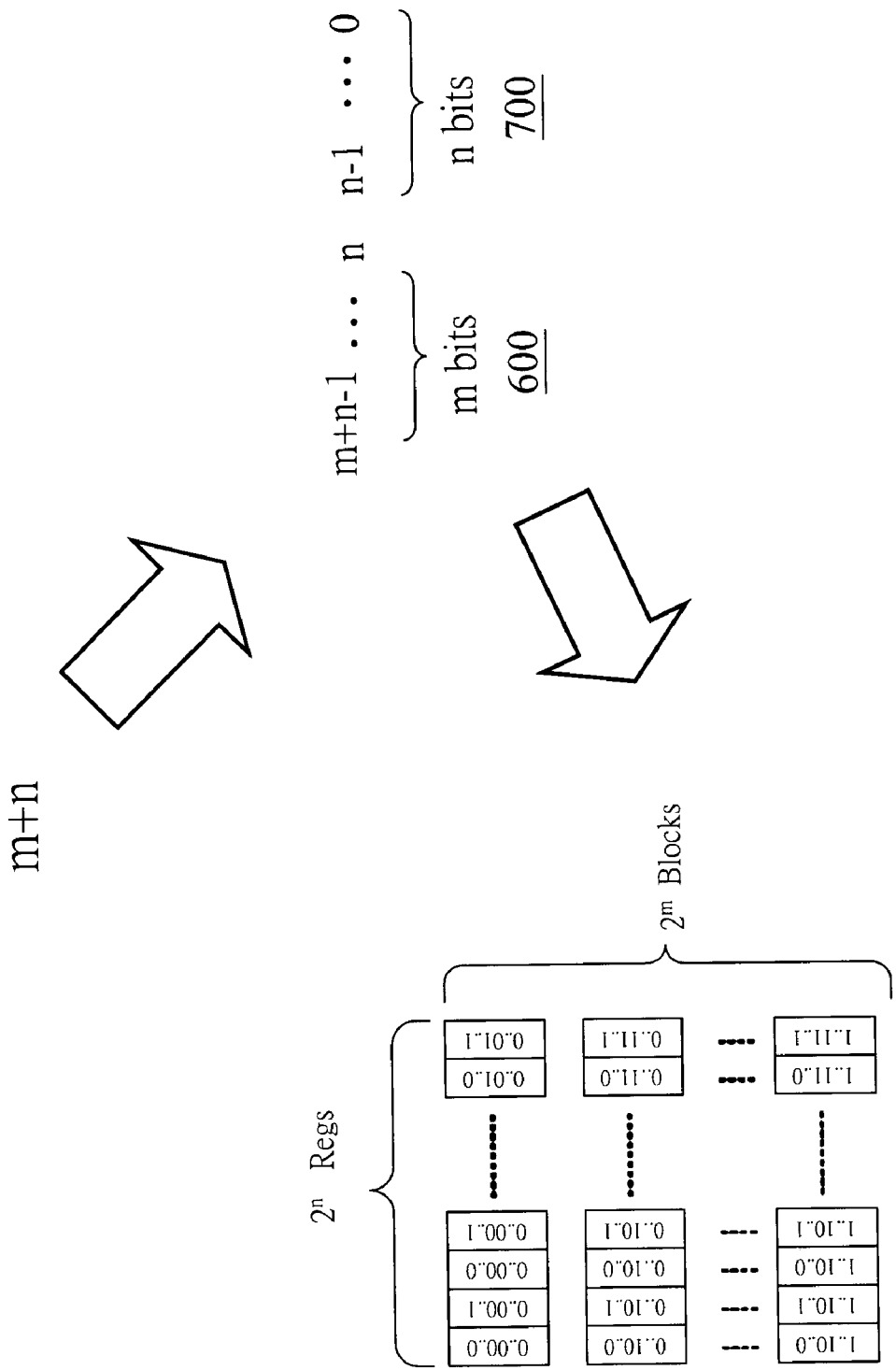
Figure 4-a

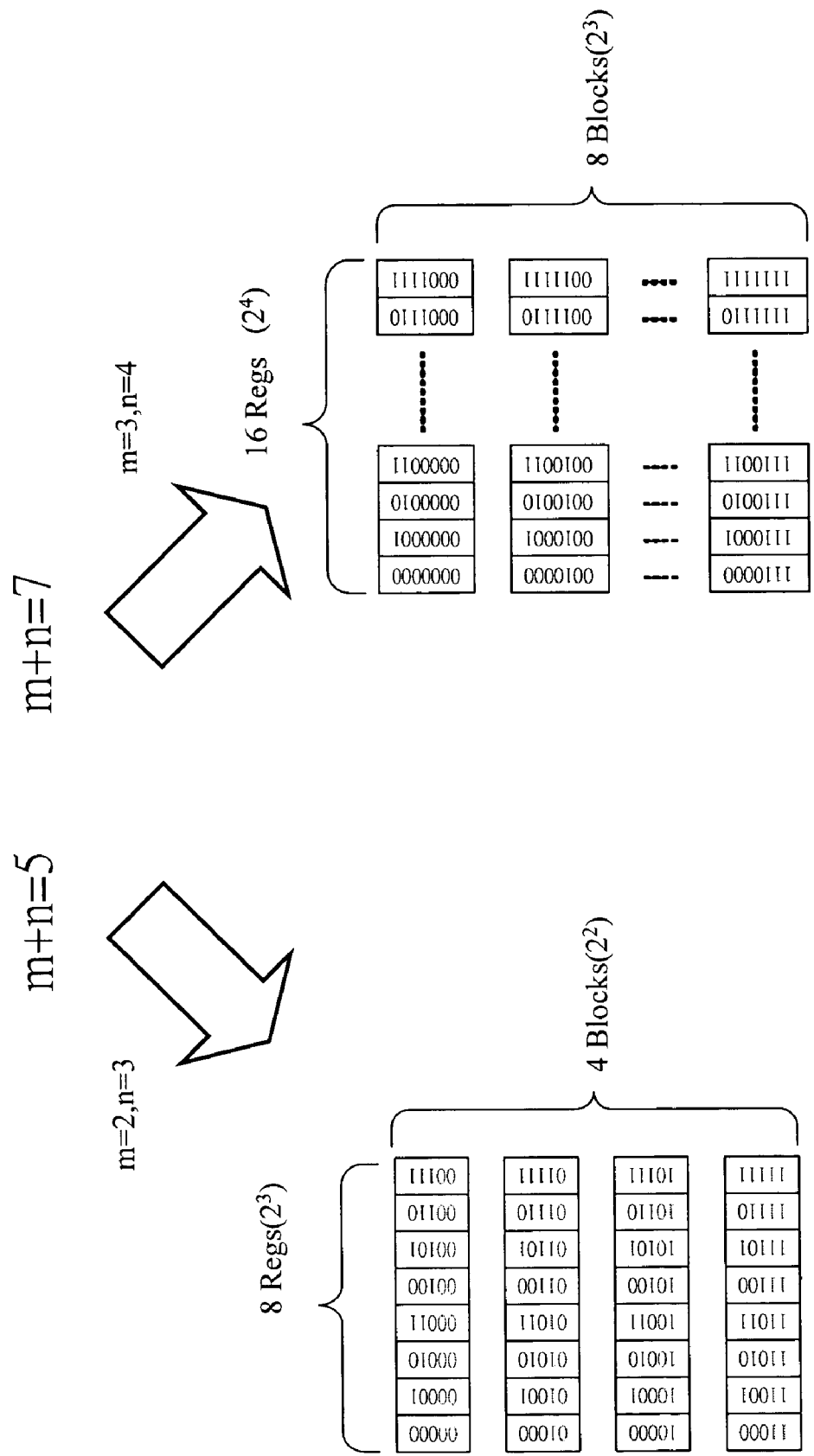
Figure 4-b

CIRCUIT DESIGN METHOD TO CONTROL ACCESS POINTERS OF DIFFERENT MEMORY

BACKGROUND OF THE INVENTION

1. Field of Invention

The invention relates to a method of designing the control signal circuits in a memory, particularly to a method of designing a control signal circuit that is used to perform buffer access in a printer, and is able to control the access pointers according to the transfer mode and improve the buffer processing efficiency in sequential mode when printing.

2. Related Art

Since the computing power of computer-based devices is more than that of printing peripherals (e.g., printers), printing peripherals usually employ several data buffering mechanisms to coordinate the unmatched data transfer speed and computing power between them.

Data buffering mechanisms usually consist of two parts: one is the control signal circuit and the other is the memory. Suppose that a memory consists of four memory blocks and each memory block consists of eight registers. These memory registers can be accessed in different transfer modes (parallel mode or sequential mode) and access modes (read mode or write mode) according to the control signal circuit. In data accessing in parallel mode (shown in FIG. 1-a) and sequential mode (shown in FIG. 1-b), after receiving a control signal, the prior control signal circuit can only control the access pointers by sending a prior read control signal 100 or a prior write control signal. As shown in FIG. 1-a, in parallel mode, four memory blocks can be accessed simultaneously by a read pointer 110 and a write pointer 220. However, as shown in FIG. 1-b, in sequential mode, only one memory block can be accessed at a time with the same access pointers (i.e., the read pointer 110 and the write pointer 220). The design of the control signal circuit has the limitation that the other three memory blocks cannot be accessed as long as one memory block is accessed.

As a result, in sequential mode, the prior designs of the control signal circuits waste a large amount of memory space, and degrade the efficiency of data buffering. It is because of their the bad designs that the control signal circuits cannot manipulate the control signals and access pointers well, and hence, waste memory space and are inefficient in data buffering. In addition, the prior designs limit the arrangement of the memory block and are not able to fulfill the requirements of data buffering. As a consequence, improving the design of the control signal circuits to increase the efficiency of data buffering especially in sequential mode is a crucial issue for control signal circuit designers.

SUMMARY OF THE INVENTION

In view of the above problems, the invention proposes a circuit design method to control access pointers of different memory blocks and a method of accessing pointers of different memory blocks in the circuit design. The proposed method is employed in printers under sequential mode to properly manipulate the access pointers of memory by the improved designs of the memory blocks and registers in the memory and the control signal circuits.

The proposed circuit design method can fully use and control all registers in the memory to improve the efficiency of data buffering and the performance of the printers. In addition, the arrangement of the designs of the control signal circuit and memory block increases the flexibility of the design of the memory block and fulfills the future requirements in the data buffering mechanism.

To achieve the above objects, the proposed circuit design method includes the following steps: retrieving the previous addresses of the read and write pointers, and receiving the control signals of the data source, analyzing the control signals, determining the control signal circuit according to the transfer mode and the access mode, setting the access pointers pointing to the corresponding memory addresses of the memory block control circuit and the register control circuit, and performing the data accesses of the printed data.

The details of the proposed method are described as follows.

DETAILED DESCRIPTION OF THE INVENTION

The invention is related to a circuit design method to control access pointers of different memory, which is a control signal circuit design method mainly employed to perform the data buffering of printers in sequential mode.

FIG. 2 shows the control flow of the proposed method in sequential mode. First, the circuit retrieves the previous addresses of the read and the write pointers before accessing the memory block (Step 800). The circuit reads the control signals from the data source (Step 810), which is usually a hardware component with computing power. Take a central processing unit (referred to as CPU) as an example. When receiving a data printing request from an application, the CPU sends a control signal to the control signal circuit using the disclosed method, wherein the content of the control signal consists of the following three parts: transfer mode (parallel or sequential mode), access mode (read or write mode) and the access number. Then, the circuit analyzes the received control signal to extract the transfer mode, access mode and the access number, and determines a control signal circuit set according to the transfer mode (Step 830). A control signal circuit set consists of the following two parts. One is the write control signal circuit, which is able to transmit memory block write control signals 550 and register write control signals 560 in sequential mode. The other one is the read control signal circuit, which is able to transmit memory block read control signals 500 and register read control signals 510. When the received control signal is in write mode, the data are written by the write control signal circuit. When the received control signal is in read mode, the data are read by the read control signal circuit. The circuit then transforms the access number from decimal to binary, and moves the corresponding access pointer (the read pointer 415 or the write pointer) of the control signal circuit set 350 to the corresponding memory address of the memory block control circuit (r_ptr_f or w_ptr_f) and register control circuit (r_ptr_ or w_ptr_) (Step 850). Finally, the circuit accesses the printed data in the memory (Step 860). The above steps are repeated until the printing job is finished.

Although the invention focuses on the circuit design in sequential mode, it also proposes the design of the control signal circuit set 350 (being able to transmit read control signals 400 and write control signals 450) in parallel mode. The circuit design also consists of a transfer mode control signal (used to transmit transfer mode control signals 300) to determine the control signal circuit set 350 according to the transfer mode.

FIGS. 3-*a* and 3-*b* show the control flow of the proposed method working in parallel mode and sequential mode, respectively. These figures are used to describe how to perform buffer transfer.

The proposed control signal circuit consists of the following parts: a transfer mode control signal circuit 300, a data access circuit in parallel mode (400 and 450), and a data access circuit in sequential mode (comprising data read control signal circuits 400 and 510, and data write control signal circuit 550 and 560). As shown in FIG. 3-*a,* in parallel mode, the transfer mode control signal circuit activates the data access circuit in parallel mode and performs parallel data accessing. On the other hand, as shown in FIG. 3-*b,* in sequential mode, the transfer mode control signal circuit activates the data access circuit in sequential mode and performs data accessing sequentially.

The cooperation of the proposed designs of the control signal circuit and the memory block is as follows. Suppose that the proposed circuit cooperates with $2^m$ memory blocks and each block consists of $2^n$ registers. After extraction, each control signal contains an (m+n)-bit binary number, where the most significant m bits indicate a block and the other n bits indicate a register in the block.

FIGS. 4-*a* and 4-*b* are used to describe the association between the control signal circuit and the memory. After extraction, each control signal contains an (m+n)-bit binary number, where the most significant m bits 600 indicate a block and the other n bits 700 indicate a register in the block. Hence, the memory must have $2^m$ memory blocks, and each block must have $2^n$ registers (as shown in FIG. 4-*a*). FIG. 4-*b* shows two examples with m+n=5 and (m, n)=(2, 3), and m+n=7 and (m, n)=(3, 4), respectively.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

BRIEF DESCRIPTION OF THE DRAWINGS

FIG. 1-*a* shows the control flow of the prior circuit design in parallel mode.

FIG. 1-*b* shows the control flow of the prior circuit design in sequential mode.

FIG. 3-*a* shows an execution scenario of the proposed method in parallel mode.

FIG. 3-*b* shows an execution scenario of the proposed method in sequential mode.

FIGS. 4-*a* and 4-*b* show the association between the proposed control signal circuit and the memory block.

Figure 2:
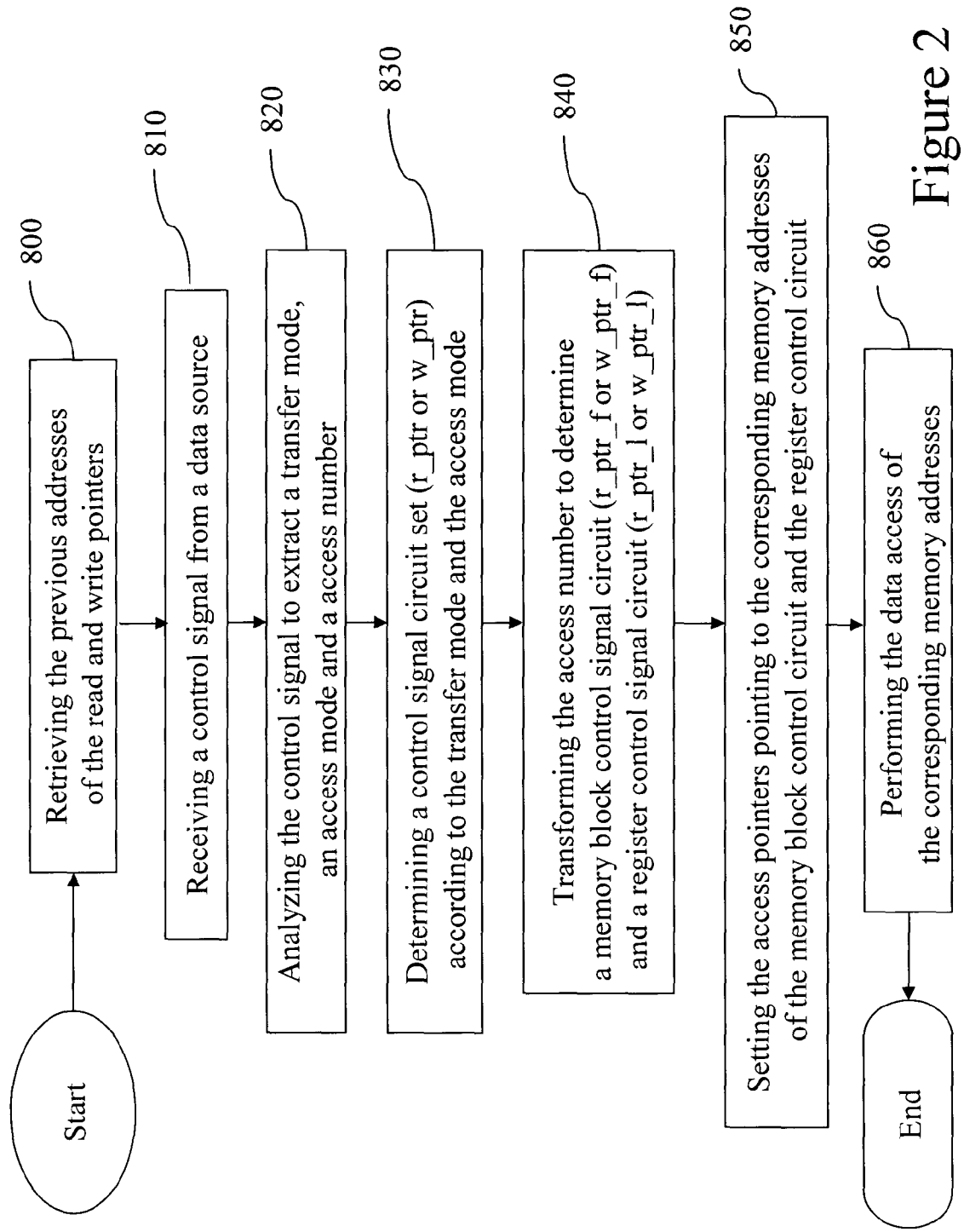
FIG. 2 shows the control flow of the proposed method.

What is claimed is:

1. A circuit design method to control access pointers of different memory, which employs an (m+n)-bit read control signal circuit and an (m+n)-bit write control signal circuit to control the access pointers of a memory with $2^m$-block, and each block has $2^n$-register in order to perform buffer access of printers, comprising the following steps:

retrieving the previous addresses of the read and write pointers;

receiving a control signal from a data source;

analyzing the control signal to extract a transfer mode, an access mode, and an access number;

determining the control signal circuit (r_ptr or w_ptr) according to the transfer mode and the access mode;

transforming the access number to determine a memory block control circuit (r_ptr_f or w_ptr_f) and a register control circuit (r_ptr_1 or w_ptr_1);

setting the access pointers pointing to the corresponding memory addresses of the memory block control circuit and the register control circuit; and performing a data access of the corresponding memory addresses.

2. In accordance with the method in claim 1, wherein the data source is a central processing unit.

3. In accordance with the method in claim 1, wherein the control signal comprises the transfer mode, the access mode and the access number.

4. In accordance with the method in claim 3, wherein the transfer mode comprises a parallel mode and a sequential mode.

5. In accordance with the method in claim 4, wherein the method further comprises the steps to determine the print mode control signal circuit set to perform the buffer access in said parallel mode or said sequential mode according to the access mode in the control signals.

6. In accordance with the method in claim 3, wherein the access number is a decimal number.

7. In accordance with the method in claim 1, wherein the control signal circuit comprises the read control signal circuit and the write control signal circuit.

8. In accordance with the method in claim 1, wherein the transformation of the access number is to transform the number into an (m+n)-bit binary number.

9. In accordance with the method in claim 1, wherein the memory block control circuit is determined by an m-bit binary number.

10. In accordance with the method in claim 1, wherein the register control signal circuit is determined by an n-bit binary number.

* * * * *